United States Patent [19]

Edwards

[11] Patent Number: 4,949,211
[45] Date of Patent: Aug. 14, 1990

[54] PROTECTIVE, BI-LEVEL DRIVE FOR FET'S

[75] Inventor: Arthur J. Edwards, Hoffman Estates, Ill.

[73] Assignee: Motorola Inc., Schaumburg, Ill.

[21] Appl. No.: 347,702

[22] Filed: May 5, 1989

[51] Int. Cl.$^5$ ............................................ H02H 7/122
[52] U.S. Cl. ........................................ 361/18; 361/42; 361/74; 361/86; 323/901; 363/50
[58] Field of Search ..................... 361/18, 58, 45, 42, 361/86, 41, 74; 323/901, 908; 324/509, 510, 523; 363/50, 55, 56

[56] References Cited

U.S. PATENT DOCUMENTS 4,716,510  12/1987  Pace et al. ............................ 323/901
4,754,386   6/1988  De Weerd ............................ 323/901

Primary Examiner—Todd E. DeBoer
Attorney, Agent, or Firm—John H. Moore

[57] ABSTRACT

A bi-level control signal is applied to an FET while the FET's drain-to-source voltage is sensed. The control signal includes a first, relatively low test level followed by a second, relatively higher operating level. The magnitude and duration of the test level are selected to produce a non-destructive current in the FET, even if the load has been shorted. If the value of the sensed drain-to-source voltage is indicative of an abnormal load condition, the FET is turned off. Otherwise, the FET is turned on by the second, relatively higher operating level of the control signal.

3 Claims, 1 Drawing Sheet

PROTECTIVE, BI-LEVEL DRIVE FOR FET'S

FIELD OF THE INVENTION

This invention is directed to the field of FET's (field effect transistors), and more particularly to a method for sensing an FET's load condition and limiting power dissipation by the FET when an abnormal load condition is sensed.

BACKGROUND OF THE INVENTION

In situations where an output transistor is used to drive a load, it is frequently desirable to ensure that the output transistor does not carry excessive current. If a short circuit should appear across the load, the resulting high current could damage the output transistor.

The way in which protection is achieved for the output transistor depends on whether the transistor is bipolar type or an FET. For bipolar transistors, complex protection circuitry is usually not required because its gain decreases rapidly at high levels of collector current. This decrease in gain tends to limit collector current to a safe level if an adequate heat sink is used and the "on" time of the transistor is sufficiently small.

For FET's, a different approach is required. This is because FET's can carry a very high current when they are turned fully on. Consequently, a more elaborate protection scheme is required in order to limit the current of the FET to a safe level when the load becomes short-circuited. Such a scheme has typically included circuitry for sensing drain current and for turning off the FET before its current level becomes destructive. These schemes perform adequately, but their extra complexity and cost are undesirable.

OBJECTS OF THE INVENTION

It is a general object of the invention to overcome the above-described drawbacks in providing protection for FET's.

It is a more specific object of the invention to provide a method for driving an FET so as to sense the presence of an abnormal load condition, and for controlling conduction of the FET without the need for current sensing apparatus and/or other relatively elaborate protective circuits.

DESCRIPTION OF THE PREFERRED EMBODIMENT

Figure 1:
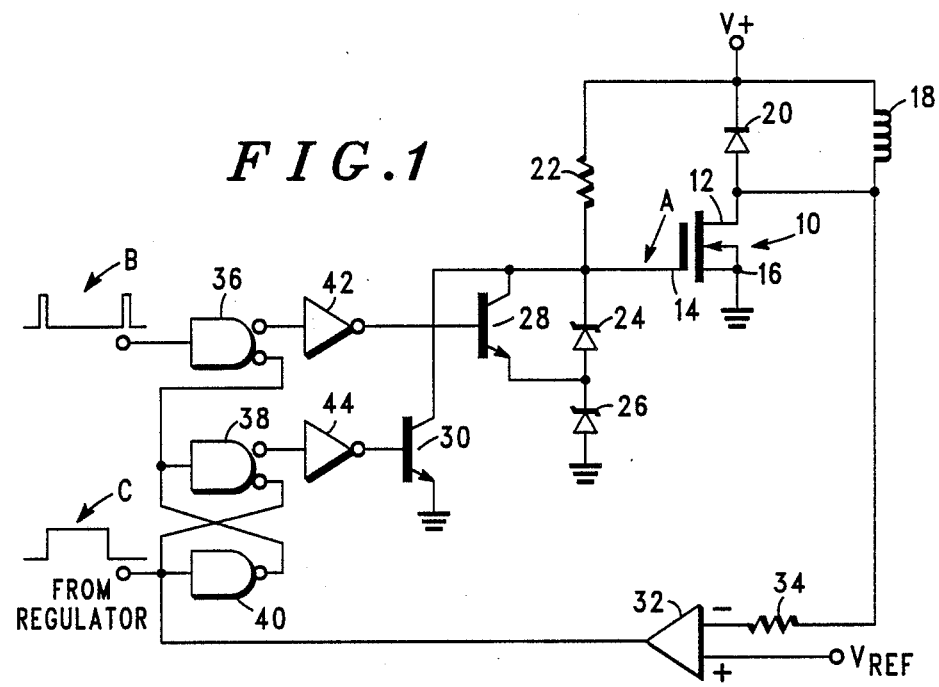
FIG. 1 is a schematic diagram showing circuitry for protectively driving an FET according to the invention.

FIG. 1 shows an exemplary FET 10 which is driven and protected according to the invention. Such an FET normally includes a drain electrode 12, a gate electrode 14 and a source electrode 16. Other types of FET's having additional electrodes may also be driven and protected by the present invention.

As shown, the drain electrode 12 is coupled to an illustrative load that includes a coil 18 in parallel with a diode 20. In this case, the source electrode 16 is connected directly to ground. No current sensing resistors or other such devices are connected to the drain electrode or the source electrode. Nevertheless, the technique used by the present invention drives the FET 10 in a manner which protects it from destructively high levels of drain current. The method used herein is relatively simple and inexpensive to implement, particularly in integrated circuit form.

This invention relies on the fact that while an FET exhibits minimum ON voltage (minimum $V_{ds}$) and minimum ON resistance at a relatively high (e.g., 10 volts) gate-to-source potential, the FET will also turn ON, albeit at a lower current level, at a relatively low (e.g. 6 volts) gate-to-source potential. With this in mind, the present invention drives the FET 10 per the following steps in order to ensure against destructive drain currents that could result from an abnormal load condition, such as would occur if a short circuit developed across the coil 18. First, I generate, and apply to the gate electrode 14, a control signal such as waveform A in FIG. 2. This control signal has a first, relatively low test level followed by a second, relatively higher normal operating level. The magnitude and duration ($t_1$) of the test level is selected to turn the FET ON and to produce a non-destructive level of drain current (e.g., 25 amps), irrespective of the condition of the load. That is, even if the coil 18 is shorted, the drain current resulting from the test level, in combination with the high drain-to-source voltage resulting from the shorted load, is incapable of damaging the FET 10. A typical duration for the test level T, is about 1% of the duty cycle of the FET.

While the test level is being applied to the gate electrode 14, the FET's drain-to-source voltage is measured. If that measurement reveals an abnormal load condition (i.e., if an abnormally high drain-to-source voltage is measured), the FET 10 is turned off instead of applying the normal operating level to the gate electrode. If that measurement reveals a normal load condition (i.e., a normal low drain-to-source voltage), the FET is permitted to turn ON fully in response to the normal operating level of the control signal. Thus, before the FET is permitted to receive a gate-to-source voltage which is capable of generating a destructively high drain current with a shorted load, the load condition is first sensed by measuring the drain-to-source voltage under non-destructive test conditions. If the test reveals an abnormal load condition capable of producing an undesirably high drain-to-source potential, the FET is turned off to prevent its destruction. This turn-off of the FET may be accompanied by a warning signal to alert the user to check and/or repair the FET's load. An exemplary circuit for carrying out the method will now be described.

Referring again to FIG. 1, bias for the FET 10 is established by a resistor 22 coupled to V+ and a pair of zener diodes 24 and 26 that are serially coupled between ground and one end of the resistor 22. To change the bias on the FET, a pair of transistors 28 and 30 are selectively turned off and on to short out one or both of the zener diodes 24, 26. More specifically, the collector of the transistor 28 is coupled to the cathode of the zener diode 24, and its emitter is coupled to the anode of the same zener diode. The transistor 30 has its collector coupled to the cathode of the zener diode 24 and its emitter coupled to ground. With this arrangement, the FET 10 may be turned ON in its test mode by turning on the transistor 28 for the time interval $t_1$ shown in FIG. 2, while holding the transistor 30 off. This will short out the zener diode 24 to establish a bias of about 6 volts at the gate of the FET. Meanwhile, the voltage at the drain of the FET is monitored by a comparator 32 whose inverting input is coupled to the FET's drain electrode via a resistor 34.

The comparator's non-inventing input receives a reference voltage $V_{ref}$ against which it compares the drain voltage of the FET. If the drain voltage exceeds $V_{ref}$, this indicates an abnormal load condition (such as a short across the coil 18), in which case the comparator 32 generates an output signal that ultimately causes the transistor 30 to be turned on. As a result, the gate electrode of the FET is pulled to near ground potential, thereby shutting off the FET and preventing its possible destruction.

If there is no detected abnormality in the load when the test interval $t_1$ ends, the transistor 28 is turned off when the waveform B goes low and the transistor 30 remains off. This allows the zeners 24 and 26 to both be in circuit and together develop a bias of about 12 volts at the gate electrode 14 of the FET. Consequently, the FET is turned on harder to produce a larger drain current (or lower ON resistance) whose level is appropriate for driving the FET's load.

Activation of the transistors 28 and 30 is effected by a small logic circuit comprising gates 36, 38 and 40, plus inverters 42 and 44. The gate 36 receives the input waveform B and develops an output that is inverted by the inverter 42 to turn on the transistor 28 during the test interval $t_1$. This causes the zener diode 24 to be short out, thereby leaving a bias of only about 6 volts on the gate electrode 14 in turn the FET on at its test level. If the comparator 32 senses an abnormally high voltage at the drain electrode of the FET during the interval $t_1$, the comparator will trigger the gates 38 and 40 to turn on the transistor 30 via the inverter 44. This turns the FET off to save it from destructively high currents which it would carry if it were to be turned on fully.

If the comparator 32 does not detect an abnormally high drain voltage during the test interval, the transistor 28 is turned off by the falling edge of waveform B, and the transistor 30 remains off. Consequently, the voltage at the gate electrodes 14 rises to about 12 volts to fully turn on the FET.

Figure 2:
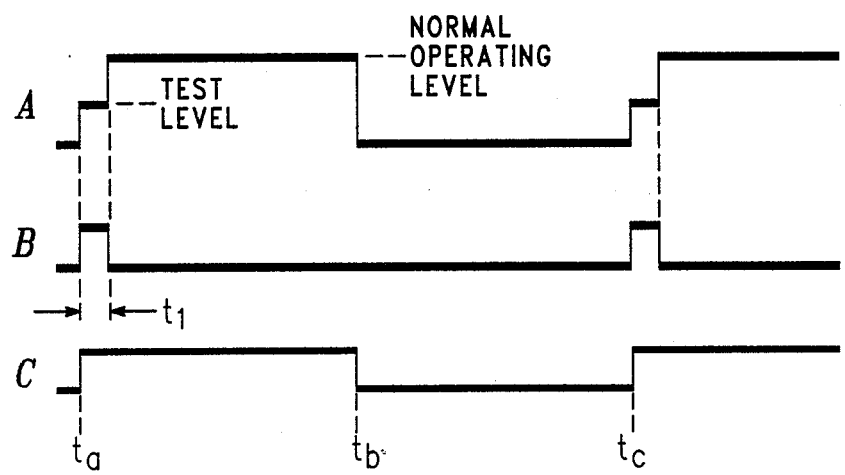
FIG. 2 shows waveforms that are useful in describing the operation of the circuitry shown in FIG. 1.

The gate 40 also receives an input (waveform C) whose function is to turn the FET on fully during its normal on time, and to turn the FET off during its normal off time. As shown in FIG. 2, the FET's normal on time may extend from $t_a$ to $t_6$, and its normal off time may extend from $t_6$ to $t_c$. The combination of the gates 38 and 40, inverter 44 and transistor 30 turns the FET off and on for those intervals except as overridden by waveform B during the test interval $t_1$.

If the comparator senses an abnormally high drain voltage while waveform B is low (i.e., after the test interval $t_1$), the logic circuit turns on the transistor 30 to turn the FET off. But note that the illustrated arrangement of the gates 36, 38 and 40 holds the transistor 30 off during the next text interval $t_1$ to ensure that a test current can flow through the FET during that time. Thus, the FET is tested during each cycle of operation, irrespective of the results of previous tests. This allows the FET to operate normally even after an intermittent fault has been detected and terminated.

Although the invention has been described in terms of a preferred embodiment, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. In an electronic circuit that uses an FET to supply current to a load, and wherein the FET has a drain electrode, a gate electrode and a source electrode, a method for protectively driving the FET, comprising:
    (a) generating, and applying to the gate electrode, a signal that has a first, relatively low, test level followed by a second, relatively higher operating level, the magnitude and the duration of the test level being selected to produce a non-destructive drain current in the FET irrespective of the impedance of the load, and the operating level being selected to produce a larger drain current whose level is appropriate for driving the load;
    (b) measuring the FET's drain-to-source potential at least while the test potential is being applied to the gate electrode;
    (c) turning the FET off when the measured value of the drain-to-source potential is high enough to indicate an abnormal load condition; and
    (d) allowing the FET turn on in response to the control signal's operating level when the value of the measured drain-to-source potential is indicative of a normal load condition.

2. A method as set forth in claim 1 further including:
    holding the FET on while the test level is being applied to the FET's gate electrode, irrespective of previously measured values of the FET's drain-to-source potential.

3. In an electronic circuit that uses an FET to supply current to a load, and wherein the FET has a drain electrode, a gate electrode and a source electrode, a method for cyclically driving the FET while also prohibiting destructively high drain currents without the need for current sensing devices, the method comprising:
    (a) applying a periodic control signal to the FET's gate electrode, the control signal including at least:
       (a) a test interval during which the control signal is at a test level selected to produce a predetermined, non-destructive level of drain current; and (b) an operating interval during which the control signal is at relatively higher operating level selected to produce a larger drain current;
    (b) holding the FET on during the test interval;
    (c) measuring the FET's drain-to-source potential during the entire duration of the control signal;
    (d) comparing the measured potential to a given reference potential;
    (e) turning the FET off when the measured value of the drain-to-source potential is higher than the given reference level; and
    (f) repeating steps (a) through (e) for each cycle of operation.

* * * * *